US010506045B2

(12) United States Patent
Volvovski et al.

(10) Patent No.: US 10,506,045 B2
(45) Date of Patent: Dec. 10, 2019

(54) MEMORY ACCESS USING DETERMINISTIC FUNCTION AND SECURE SEED

(71) Applicant: International Business Machines Corporation, Armonk, NY (US)

(72) Inventors: Ilya Volvovski, Chicago, IL (US); Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 70 days.

(21) Appl. No.: 15/836,450

(22) Filed: Dec. 8, 2017

(65) Prior Publication Data

US 2018/0103101 A1    Apr. 12, 2018

Related U.S. Application Data

(63) Continuation-in-part of application No. 15/812,706, filed on Nov. 14, 2017, now Pat. No. 10,362,111, which is a continuation of application No. 14/956,818, filed on Dec. 2, 2015, now Pat. No. 9,826,038.

(60) Provisional application No. 62/109,712, filed on Jan. 30, 2015.

(51) Int. Cl.
*H03M 13/15* (2006.01)
*H04L 29/08* (2006.01)
*H03M 13/37* (2006.01)
*H03M 13/09* (2006.01)

(52) U.S. Cl.
CPC .... *H04L 67/1097* (2013.01); *H03M 13/3761* (2013.01); *H03M 13/09* (2013.01); *H03M 13/1515* (2013.01)

(58) Field of Classification Search
CPC ....................................................... H03M 13/15
USPC ............................................................ 714/759
See application file for complete search history.

(56) References Cited

U.S. PATENT DOCUMENTS

| 4,092,732 | A | 5/1978 | Ouchi |
| 5,454,101 | A | 9/1995 | Mackay et al. |
| 5,485,474 | A | 1/1996 | Rabin |
| 5,774,643 | A | 6/1998 | Lubbers et al. |
| 5,802,364 | A | 9/1998 | Senator et al. |

(Continued)

OTHER PUBLICATIONS

Chung; An Automatic Data Segmentation Method for 3D Measured Data Points; National Taiwan University; pp. 1-8; 1998.

(Continued)

*Primary Examiner* — Fritz Alphonse
(74) *Attorney, Agent, or Firm* — Garlick & Markison; Edward J. Marshall

(57) ABSTRACT

A processing device implementing a storage unit is included in a distributed storage network (DSN) that uses employing one or more storage units to store encoded data slices. The storage unit receives an access request that includes a slice identifier associated with an encoded data slice stored in a particular distributed storage (DS) memory of the storage unit. The storage unit obtains a secure seed, and determines a memory range associated with the slice identifier by performing a deterministic function on the slice identifier using the secure seed as an input to the deterministic function. The storage unit identifies the particular DS memory as being associated with the memory range, and performs the access request using the particular DS memory.

20 Claims, 6 Drawing Sheets

(56) References Cited

U.S. PATENT DOCUMENTS

| | | |
|---|---|---|
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2014/0122924 A1* | 5/2014 | Kazi ............... H04L 67/1097 714/6.22 |
| 2014/0245063 A1* | 8/2014 | Baptist ............ G06F 11/2094 714/6.22 |
| 2015/0227414 A1 | 8/2015 | Varma |
| 2015/0378822 A1* | 12/2015 | Grube ............ G06F 11/1092 714/763 |
| 2016/0117219 A1 | 4/2016 | Halbert et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): String Representation of Distinguished Names; IETF Network Working Group; RFC 4514; Jun. 2006; pp. 1-15.

* cited by examiner

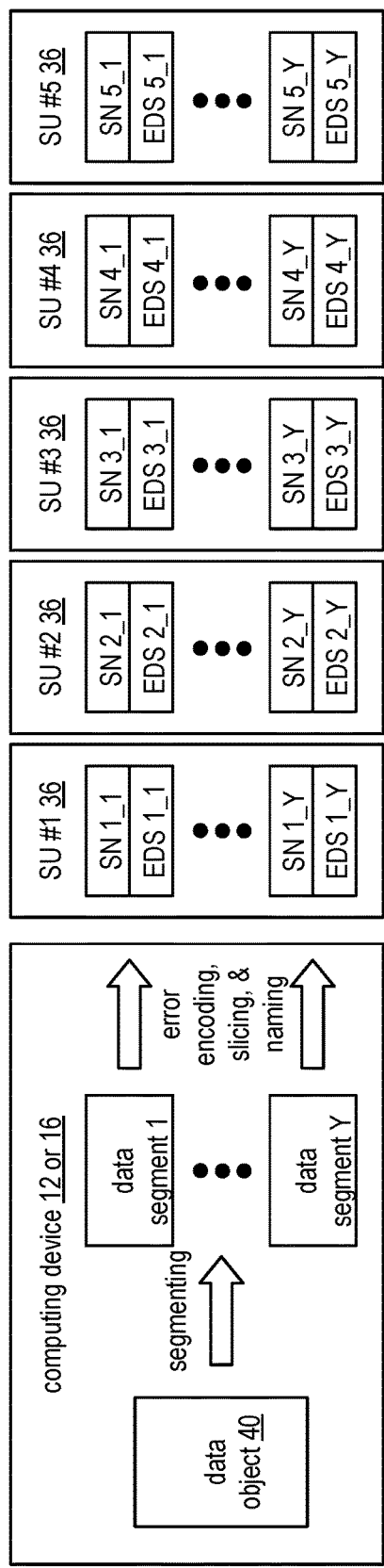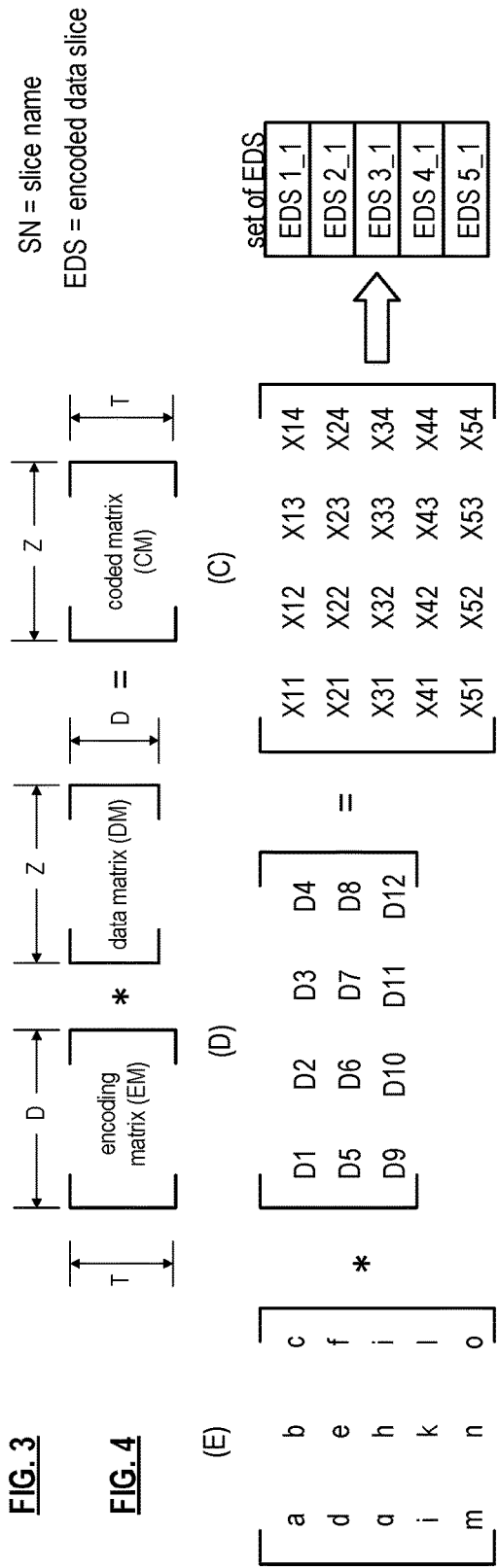

MEMORY ACCESS USING DETERMINISTIC FUNCTION AND SECURE SEED

CROSS-REFERENCE TO RELATED APPLICATIONS

The present U.S. Utility Patent Application claims priority pursuant to 35 U.S.C. § 120 as a continuation-in-part of U.S. Utility application Ser. No. 15/812,706 entitled "SELECTING A DATA STORAGE RESOURCE OF A DISPERSED STORAGE NETWORK" filed Nov. 14, 2017, which claims priority pursuant to 35 U.S.C. § 120 as a continuation of U.S. Utility application Ser. No. 14/956,818 entitled "SELECTING A DATA STORAGE RESOURCE OF A DISPERSED STORAGE NETWORK" filed Dec. 2, 2015, now U.S. Pat. No. 9,826,038 issued on Nov. 21, 2017, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, all of which are hereby incorporated herein by reference in their entirety and made part of the present U.S. Utility Patent Application for all purposes.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Currently available dispersed storage techniques sometimes depend on a deterministic function to determine where to store the dispersed data. Usually, such conventional systems assume that the deterministic function will result in an even distribution of access requests across the system. Unfortunately, it may be possible for a bad actor having knowledge of the deterministic function to identify where particular data is stored, thereby allowing an attack that can seriously degrade system performance.

BRIEF DESCRIPTION OF THE DRAWINGS

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION

Figure 1:
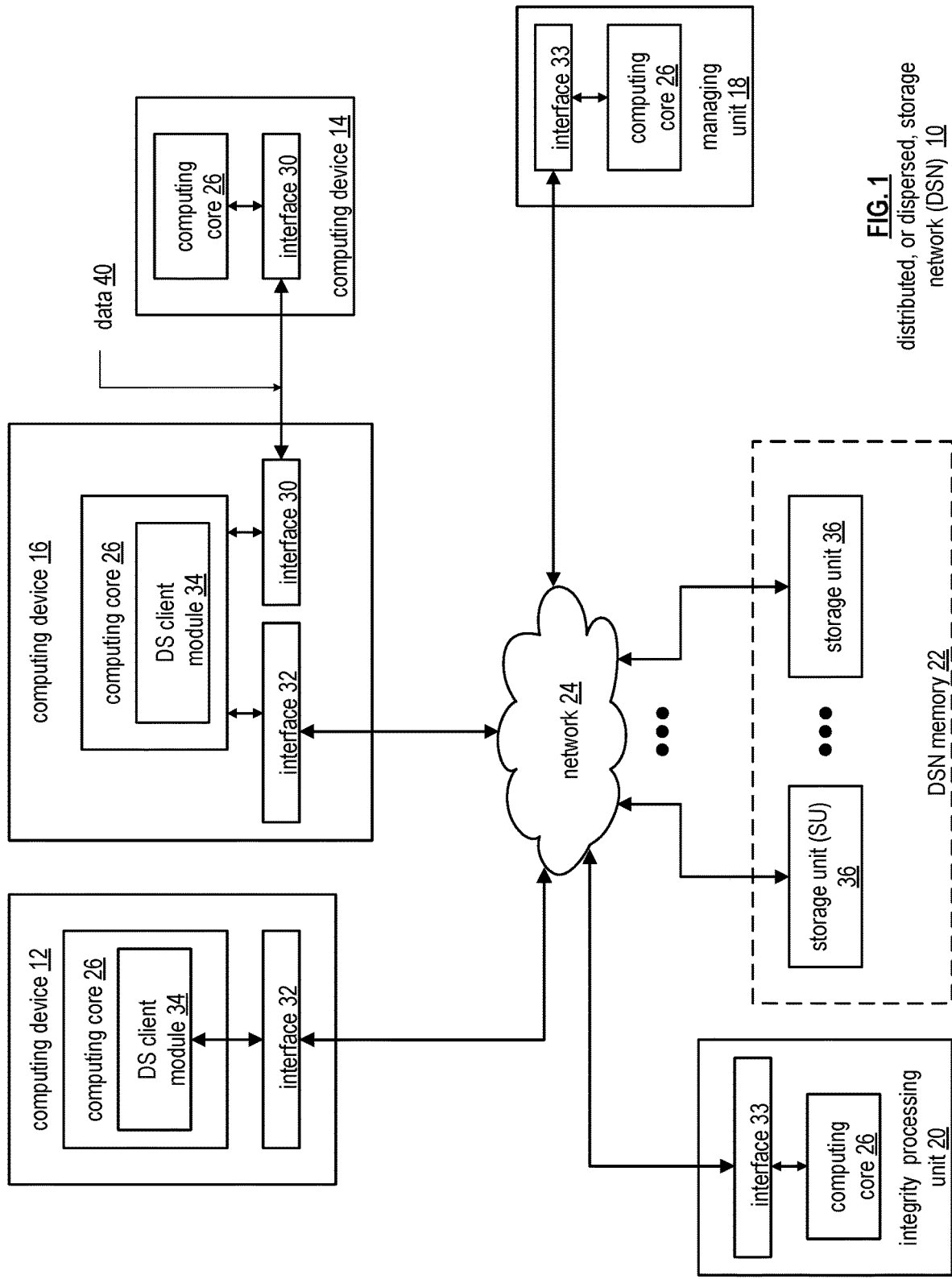
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
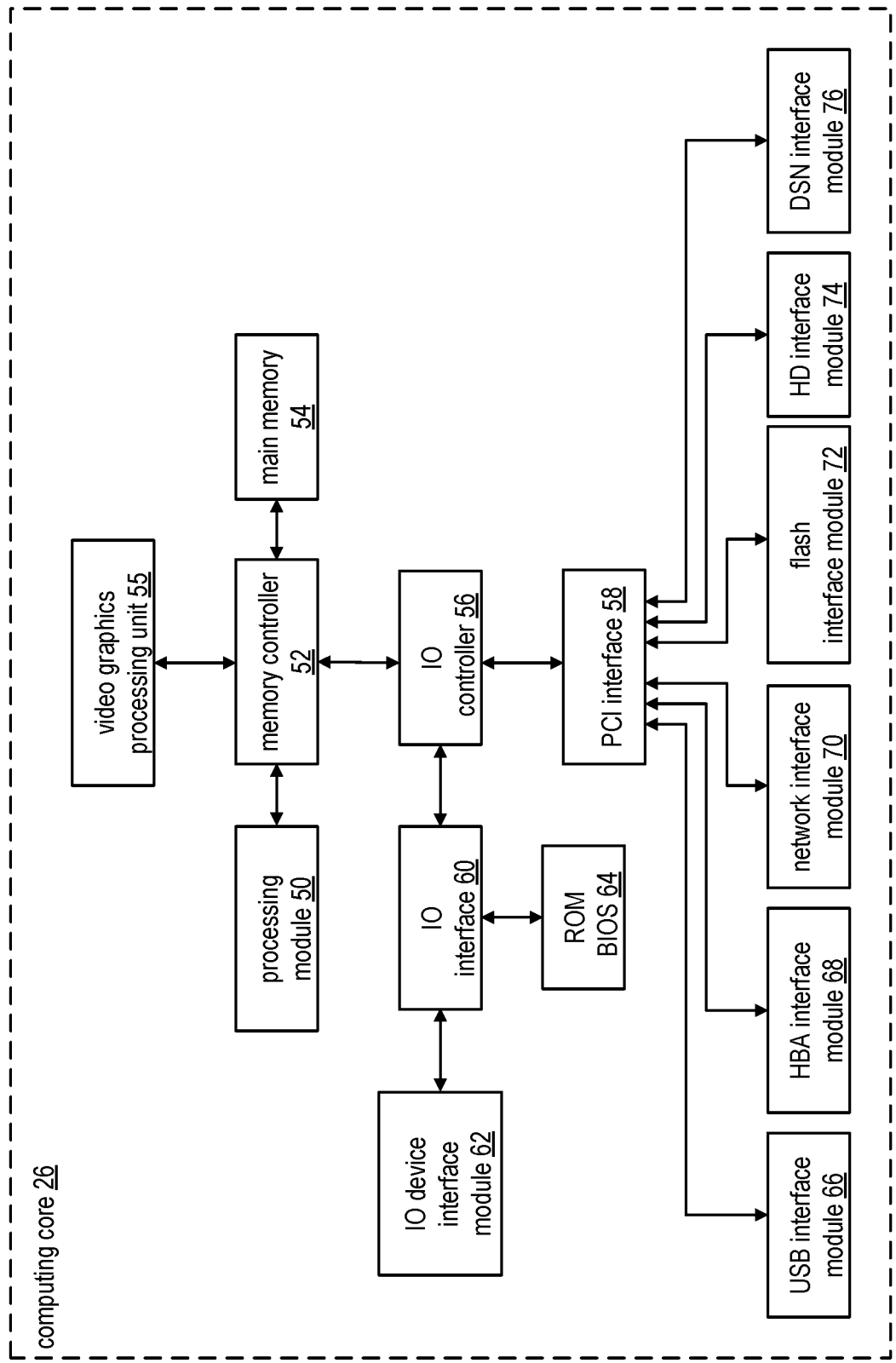
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
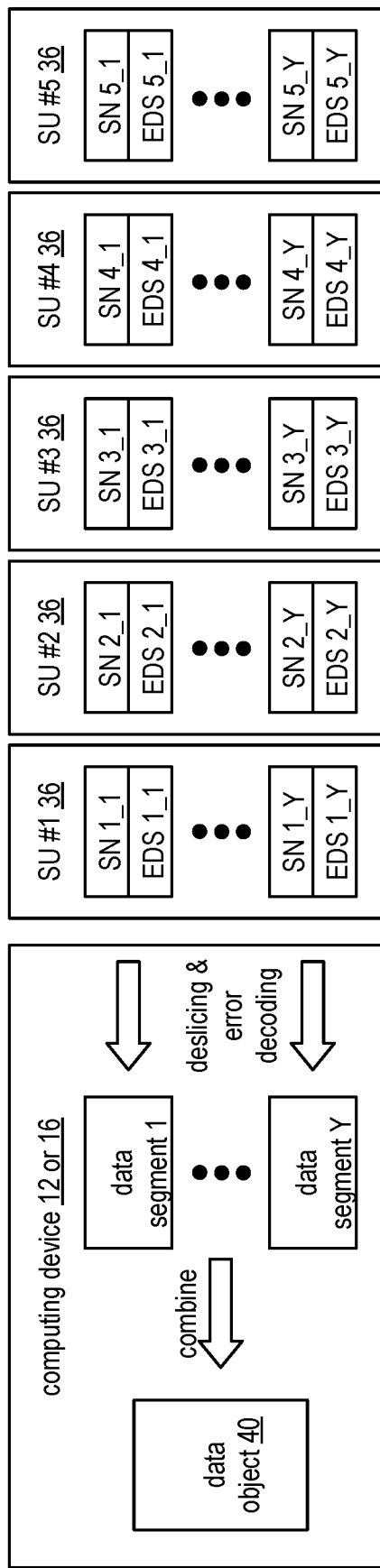
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
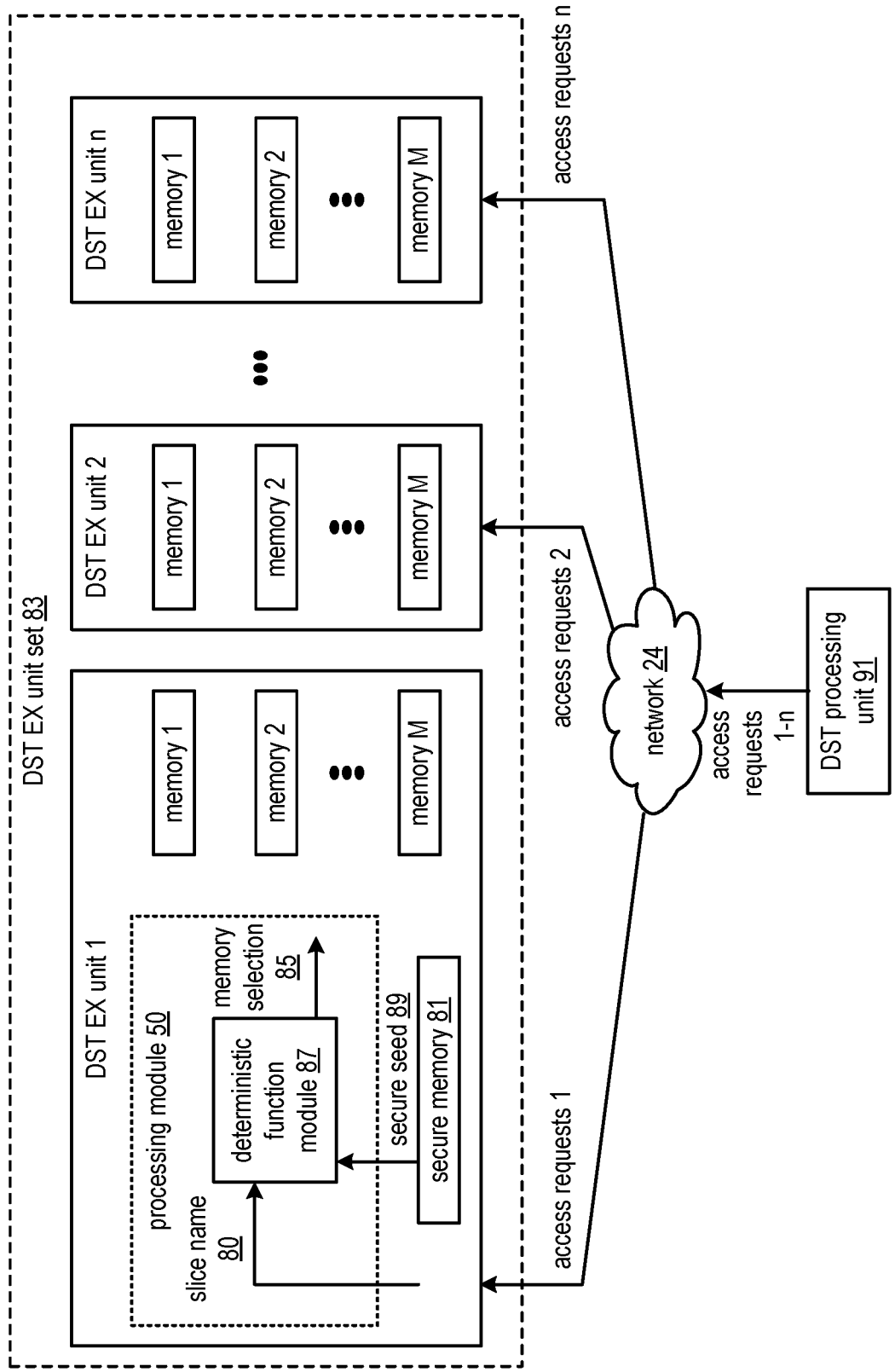
FIG. 9 is a schematic block diagram of an embodiment of a dispersed storage network (DSN) in accordance with the present invention.
Figure 10:
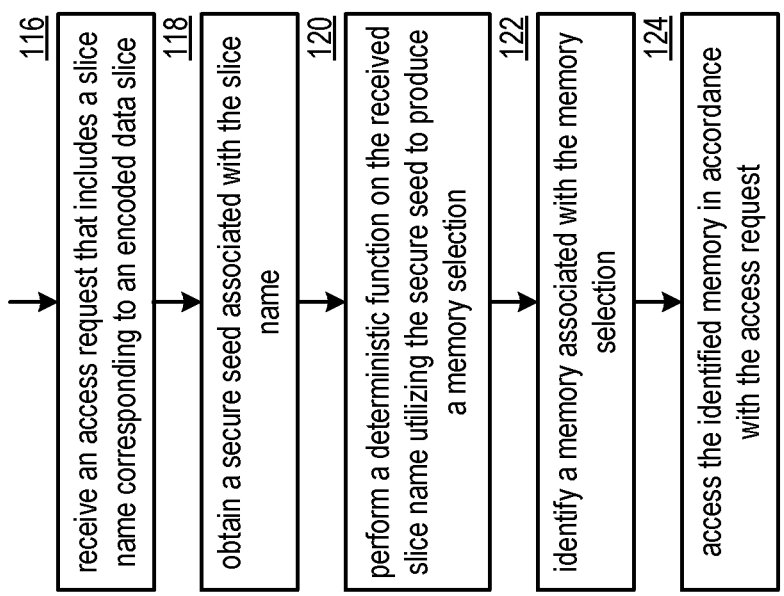
FIG. 10 is a flowchart illustrating an example of selecting a memory for accessing encoded data slices in accordance with the present invention.

Referring next to FIGS. 9 and 10, various embodiments of accessing data in distributed memories based on a deterministic function will discussed. Within a distributed storage (ds) unit, sometimes referred to simply as a storage unit, some data storage methods depend on computing a hash against some or all of received slice names, where the hash is a deterministic function that maps all possible slice names to values on a fixed range. Often, the assumption is that the hash function is uniformly distributed, such that all possible hash values are equally likely for any slice name. This property can be used to evenly distribute data across storage containers, whether virtual or logical, within the ds unit.

However, a malicious agent, with knowledge of the specifications for the hash function used by the ds unit, might be able to pre-select slice names which are known to fall into the same, small range of output values generated by the hash function. For example, if the hash function's output is 16 bits, then there are $2^{16}$ (65536) possible values. If the malicious agent knows that all slice names whose hash has a value between 1024 and 2048 are mapped to the same storage location, then the attacker may determine slice names having that property, and then perform a higher than normal set of IO operations using such names. This can violate the assumption of uniformity built into the design of the ds units storage, and cause poor performance or failure of the ds unit, e.g. by exceeding the number of items within a virtual or logical container.

To prevent this, in various embodiments each ds unit generates, in some cases upon initialization, a long random number, which may be chosen from a true random source or from a cryptographically strong pseudorandom source. Instead of calculating the hash value directly from the slice name, or any other input received, the hash value incorporates this random value into the calculation. If a malicious agent does not know the random value, which is unique per ds unit, it becomes impossible to predict the outputs of the hash function, even if the malicious agent knows the specifications of the hash function. As a result, the malicious agent cannot determine which slice names hash to similar or identical values.

FIG. 9 is a schematic block diagram of another embodiment of a dispersed storage network (DSN) that includes a distributed storage and task (DST) execution (EX) unit set 83, the network 24 of FIG. 1, and a DST processing unit 91, such as computing device 16 of FIG. 1. The DST execution unit set includes a set of DST execution units 1-$n$. Each DST execution unit includes a plurality of memories 1-M, a secure memory 81, and the processing module 50 of FIG. 2. Each processing module 50 includes a deterministic function module 87 capable of performing at least one deterministic function. Each DST execution unit may be implemented utilizing storage unit 36 of FIG. 1. The secure memory 81 may be implemented utilizing main memory 54 of FIG. 2 or some other memory included computing core 26, and implemented such that a probability of remote access is substantially zero. Each memory 1-M, sometimes referred to herein as distributed storage (DS) memories, can be implemented utilizing any of various memory types used store encoded data slices under control of the DST EX units.

The DSN functions to access a set of memories for storage of data, where the data is dispersed storage error encoded utilizing an information dispersal algorithm (IDA) function to produce a plurality of sets of encoded data slices for storage in the set of DST execution units 1-$n$. Each set of encoded data slices is associated with a set of slice names. Each set of slice names corresponds to a particular combination of memories of each of the DST execution units in accordance with the deterministic function. For example, a first set of memories includes the memory 1 of the DST execution unit 1, the memory 3 of the DST execution unit 2, the memory 10 of the DST execution unit 3, etc. As such, a set of encoded data slices may be associated with different memories of each of the DST execution units and encoded data slices of consecutive slice names may be associated with different sets of memories to provide a system security improvement.

In an example of operation of the accessing of the set of memories, a DST execution unit of the set of DST execution units receives an access request that includes a slice name 80 corresponding to an encoded data slice. The access request may include one of a write slice request, a read slice request, a delete slice request, and a list slice request. For example, the DST execution unit 1 receives an access request 1 that includes a write slice request for an encoded data slice of a slice name 1.

Having received the access request, the processing module 50 of the DST execution unit obtains a secure seed 89 associated with the DST execution unit. The secure seed 89 includes a predetermined number that is associated with the DST execution unit that may be utilized to seed the deterministic function such that the deterministic function produces an output that is unique as compared to utilization of another secure seed for a given common input. The obtaining includes at least one of retrieving the secure seed 89 from the secure memory 81 and recovering the secure seed 89 from the set of DST execution units 1-$n$ (e.g., recovery a decode threshold number of encoded seed slices corresponding to the secure seed, dispersed storage error decoding the decode threshold number of encoded seed slices to reproduce the secure seed 89).

The DST execution unit may generate the secure seed 89 once for the DST execution unit (e.g., upon initial deployment of the DST execution unit). The generating includes utilizing a cryptographically strong pseudorandom number generator to produce a random number as the secure seed 89. As such, each DST execution unit may generate a unique secure seed that is stored in the corresponding secure memory of each of the DST execution units without external access.

Having obtained the secure seed 89, the deterministic function module 87 performs the deterministic function on the slice name 80 of the access request utilizing the secure seed 89 to produce a memory selection 85 where (e.g., an output indicating a value between 1-M). The deterministic function includes one or more of a hashing function, a hash based message authentication code function, a mask generating function, a logical function, and a sponge function. For example, the deterministic function module of the DST execution unit 1 performs the hash based message authentication code on the slice name 1 utilizing the secure seed 89 of the DST execution unit 1 as an encryption key to produce an intermediate value and performs a mask generating function on the intermediate value to produce the memory selection 85 with a value of 2 to select memory 2.

Having produced the memory selection 85, the DST execution unit accesses a memory corresponding to the memory selection 85 in accordance with the access request. For example, the DST execution unit 1 accesses the memory 2 to store the encoded data slice associated with the slice name of 1. Substantially simultaneously, the DST execution unit 2 may produce a corresponding memory selection to select the memory 11 of the DST execution unit 2 for storage of another encoded data slice associated with a slice name of 2, where the set of encoded data slices includes the encoded data slice of the slice name 1 and encoded data slice of the slice name 2. As such, for a given slice name, each DST execution unit will access a consistent memory for subsequent access requests, where each of the DST execution units likely utilizes a different memory (e.g., memory 2, memory 11, etc., rather than all memory 1 of each DST execution unit).

FIG. 10 is a flowchart illustrating an example of selecting a memory for accessing encoded data slices. The method includes step 116 where a processing module of a storage unit (e.g., of a distributed storage and task (DST) execution unit) receives an access request that includes a slice name corresponding to an encoded data slice. The receiving includes at least one of receiving a write slice request, receiving a read slice request, receiving a delete slice request, and receiving a list slice request. The receiving further includes interpreting the access request to extract the slice name.

The method continues at step 118 where the processing module obtains a secure seed associated with the slice name. The obtaining includes at least one of retrieving the secure seed from a local secure memory and recovering the secure seed from a dispersed storage network (DSN) memory. The obtaining may further include, when the secure seed does not exist, the processing module generating the secure seed and storing the secure seed in one or more of the local secure memory and the DSN memory.

The method continues at step 120 where the processing module performs a deterministic function on the received slice name utilizing the secure seed to produce a memory selection. The performing may include selecting the deterministic function based on one or more of a predetermination, a slice name, a lookup, and a function identifier of the access request. The performing further includes execution of the selected deterministic function on the received slice name utilizing the secure seed to see the deterministic function to produce the memory selection.

The method continues at step 122 where the processing module identifies a memory associated with the memory selection. The identifying includes at least one of performing a lookup utilizing the memory selection to produce a memory identifier, performing a reducing function on the memory selection to produce the memory identifier, and combining the memory selection with a memory constant to produce the memory identifier.

The method continues at step 124 where the processing module accesses the identified memory in accordance with the access request. The accessing includes at least one of storing the encoded data slice in the identified memory when the access request includes the write slice request, retrieving encoded data slice from the identified memory when the access request includes the read slice request, deleting the encoded data slice from the identified memory when the access request includes the delete slice request, and performing a slice integrity and/or listing function on the encoded data slice from the identified memory when the access request includes the list slice request.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a processing device configured to implement a storage unit, the storage unit included in a distributed storage network (DSN) employing one or more storage units to store encoded data slices, the method comprising:
   receiving, by the storage unit, an access request, the access request including a slice identifier associated with an encoded data slice stored in a particular distributed storage (DS) memory of the storage unit;
   obtaining, by the storage unit, a secure seed;
   determining, by the storage unit, a memory range associated with the slice identifier by performing a deterministic function on the slice identifier using the secure seed as an input to the deterministic function;
   identifying, by the storage unit, the particular DS memory as being associated with the memory range; and
   performing the access request using the particular DS memory.

2. The method of claim 1, wherein obtaining the secure seed includes:
   retrieving a previously generated secure seed from a secure memory in response to receiving the access request.

3. The method of claim 1, wherein obtaining the secure seed includes:
   generating the secure seed in response to receiving the access request; and
   storing the secure seed in a secure memory.

4. The method of claim 1, wherein obtaining the secure seed includes:
   recovering the secure seed from a DS memory.

5. The method of claim 1, further comprising:
   performing the deterministic function on the slice identifier includes performing one of a hash based message authentication code function, a mask generating function, or a sponge function.

6. The method of claim 1, further comprising:
   selecting the deterministic function from a plurality of potential deterministic functions based on one or more of a predetermination, the slice identifier, a lookup, or a function identifier associated with the access request.

7. The method of claim 1, wherein identifying the particular DS memory includes:

combining the memory range with a memory constant to produce a memory identifier identifying the particular DS memory.

8. A storage unit for use in a distributed storage network (DSN) employing one or more storage units to store encoded data slices, the storage unit comprising:
a processor and associated memory configured to implement a deterministic function module;
a plurality of distributed storage (DS) memories configured to store the encoded data slices;
an interface configured to receive an access request, the access request including a slice identifier associated with an encoded data slice stored in a particular DS memory of the storage unit;
the deterministic function module configured to:
obtain a secure seed;
determine a memory range associated with the slice identifier by performing a deterministic function on the slice identifier using the secure seed as an input to the deterministic function;
identify the particular DS memory as being associated with the memory range; and
the processor and associated memory further configured to:
perform the access request using the particular DS memory.

9. The storage unit of claim 8, further comprising:
a secure memory; and
the deterministic function module being further configured to retrieve a previously generated secure seed from the secure memory.

10. The storage unit of claim 8, further comprising:
a secure memory;
the deterministic function module being further configured to:
generate the secure seed in response to the access request; and
store the secure seed in a secure memory.

11. The storage unit of claim 8, further comprising:
a secure memory; and
the deterministic function module being further configured to recover the secure seed from a DS memory included in the plurality of distributed storage (DS) memories.

12. The storage unit of claim 8, the deterministic function module being further configured to:
perform the deterministic function on the slice identifier by using one of a hash based message authentication code function, a mask generating function, or a sponge function.

13. The storage unit of claim 8, the deterministic function module being further configured to:
select the deterministic function from a plurality of potential deterministic functions based on one or more of a predetermination, the slice identifier, a lookup, or a function identifier associated with the access request.

14. The storage unit of claim 8, wherein the deterministic function module is further configured to:
identify the particular DS memory by combining the memory range with a memory constant to produce a memory identifier identifying the particular DS memory.

15. A distributed storage network (DSN) memory for use in a distributed storage network (DSN), the DSN memory including:
a set of storage units storing encoded data slices, at least one storage unit included in a set of storage units includes:
a processor and associated memory configured to implement a deterministic function module;
a plurality of distributed storage (DS) memories configured to store the encoded data slices;
an interface configured to receive an access request, the access request including a slice identifier associated with an encoded data slice stored in a particular DS memory;
the deterministic function module configured to:
obtain a secure seed;
determine a memory range associated with the slice identifier by performing a deterministic function on the slice identifier using the secure seed as an input to the deterministic function;
identify the particular DS memory as being associated with the memory range; and
the processor and associated memory further configured to:
perform the access request using the particular DS memory.

16. The distributed storage network (DSN) memory of claim 15, the at least one storage unit included in a set of storage units further including:
a secure memory;
the deterministic function module being further configured to:
generate the secure seed in response to the access request; and
store the secure seed in a secure memory.

17. The distributed storage network (DSN) memory of claim 15, the at least one storage unit included in a set of storage units further including:
a secure memory; and
the deterministic function module being further configured to recover the secure seed from a DS memory included in the plurality of distributed storage (DS) memories.

18. The distributed storage network (DSN) memory of claim 15, the deterministic function module being further configured to:
perform the deterministic function on the slice identifier by using one of a hash based message authentication code function, a mask generating function, or a sponge function.

19. The distributed storage network (DSN) memory of claim 15, the deterministic function module being further configured to:
select the deterministic function from a plurality of potential deterministic functions based on one or more of a predetermination, the slice identifier, a lookup, or a function identifier associated with the access request.

20. The distributed storage network (DSN) memory of claim 15, wherein the deterministic function module is further configured to:
identify the particular DS memory by combining the memory range with a memory constant to produce a memory identifier identifying the particular DS memory.

* * * * *